(12) United States Patent
Nandakumar

(10) Patent No.: US 9,564,427 B2
(45) Date of Patent: Feb. 7, 2017

(54) SCHOTTKY DIODES FOR REPLACEMENT METAL GATE INTEGRATED CIRCUITS

(71) Applicant: Texas Instruments Incorporated, Dallas, TX (US)

(72) Inventor: Mahalingam Nandakumar, Richardson, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/996,360

(22) Filed: Jan. 15, 2016

(65) Prior Publication Data

US 2016/0133622 A1    May 12, 2016

Related U.S. Application Data

(62) Division of application No. 14/576,813, filed on Dec. 19, 2014, now Pat. No. 9,275,988.

(60) Provisional application No. 61/921,500, filed on Dec. 29, 2013.

(51) Int. Cl.
| | |
|---|---|
| H01L 27/06 | (2006.01) |
| H01L 29/49 | (2006.01) |
| H01L 29/872 | (2006.01) |
| H01L 29/47 | (2006.01) |
| H01L 29/66 | (2006.01) |
| H01L 29/36 | (2006.01) |

(52) U.S. Cl.
CPC ........ *H01L 27/0629* (2013.01); *H01L 29/36* (2013.01); *H01L 29/47* (2013.01); *H01L 29/4966* (2013.01); *H01L 29/66143* (2013.01); *H01L 29/66545* (2013.01); *H01L 29/872* (2013.01)

(58) Field of Classification Search
None
See application file for complete search history.

(56) References Cited

U.S. PATENT DOCUMENTS

| | | | |
|---|---|---|---|
| 4,764,799 A | 8/1988 | Malaviya | |
| 5,486,718 A * | 1/1996 | Robb | .................. H01L 29/0615 257/630 |
| 6,576,948 B2 | 6/2003 | Hofmann et al. | |
| 2004/0033666 A1* | 2/2004 | Williams | .......... H01L 21/26513 438/297 |
| 2005/0073010 A1 | 4/2005 | Lai et al. | |
| 2006/0202264 A1* | 9/2006 | Bhalla | ................. H01L 29/1095 257/330 |
| 2007/0069306 A1* | 3/2007 | Kapoor | ............... H01L 27/0629 257/369 |
| 2007/0096237 A1* | 5/2007 | Zhao | .................... H01L 29/0615 257/438 |
| 2008/0191216 A1* | 8/2008 | Machida | ................. H01L 25/18 257/76 |
| 2008/0258226 A1 | 10/2008 | Ishiguro | |
| 2010/0276728 A1* | 11/2010 | Hsieh | .................. H01L 27/0255 257/139 |
| 2012/0126317 A1* | 5/2012 | Ng | ...................... H01L 27/0629 257/331 |
| 2012/0187498 A1 | 7/2012 | Qu et al. | |

(Continued)

*Primary Examiner* — Thao P Le
(74) *Attorney, Agent, or Firm* — Jacqueline J. Garner; Charles A. Brill; Frank D. Cimino

(57) ABSTRACT

An integrated circuit and method with a metal gate transistor and with a Schottky diode where the metal used to form the Schottky diode is the metal used to form the metal gate.

9 Claims, 8 Drawing Sheets

(56) References Cited

U.S. PATENT DOCUMENTS

| | | | |
|---|---|---|---|
| 2012/0217541 A1* | 8/2012 | Hsieh | H01L 29/7397 257/140 |
| 2012/0248530 A1* | 10/2012 | Lui | H01L 27/0629 257/334 |
| 2012/0273892 A1 | 11/2012 | Uno et al. | |
| 2012/0306018 A1 | 12/2012 | Gates et al. | |
| 2013/0001699 A1 | 1/2013 | Tai et al. | |
| 2013/0087828 A1 | 4/2013 | Koshimizu et al. | |

* cited by examiner

SCHOTTKY DIODES FOR REPLACEMENT METAL GATE INTEGRATED CIRCUITS

CROSS-REFERENCE TO RELATED APPLICATIONS

This application is a divisional of U.S. Nonprovisional patent application Ser. No. 14/576,813, filed Dec. 19, 2014, and claims the benefit of U.S. provisional application Ser. No. 61/921,500, filed Dec. 29, 2013, the contents of which are herein incorporated by reference.

FIELD OF INVENTION

This invention relates to the field of integrated circuits. More particularly, this invention relates to the formation of Schottky diodes in integrated circuits.

BACKGROUND

Integrated circuits for high speed applications frequently employ Schottky diodes because of their fast switching speed. A Schottky diode is formed by contact between a metal and a lightly doped semiconductor (typically silicon). When a forward bias voltage is applied across the diode, the potential barrier (Schottky barrier) between the metal and silicon is lowered and an electric field is established in the silicon. The majority carriers (electrons in N type or holes in P type silicon) to move in the direction of the field and create current flow. Since there is no stored charge in the Schottky diode, the forward current in the diode is extinguished very quickly when the bias voltage is reduced to zero or reversed. This allows the diode to switch on and off rapidly making it very attractive for high speed applications. Conventional pn junction diodes switching speed is typically on the order of about 100 ns. Schottky barrier diode switching speed is on the order of about 100 ps—three orders of magnitude faster.

Metals such as aluminum and copper and refractory metal silicides such as are commonly used in conventional polysilicon gate integrated circuits typically have too low a Schottky barrier height to form useful Schottky diodes. Typically, addition of useful Schottky diodes to a conventional integrated circuit requires a significant number of additional processing steps to deposit, pattern, and etch the Schottky metal. These extra processing steps add substantial cost to the process.

SUMMARY

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

An integrated circuit and method have a metal gate transistor and a Schottky diode where the metal used to form the Schottky diode is the metal used to form the metal gate.

DETAILED DESCRIPTION OF EXAMPLE EMBODIMENTS

The present invention is described with reference to the attached figures. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

Figure 1A:
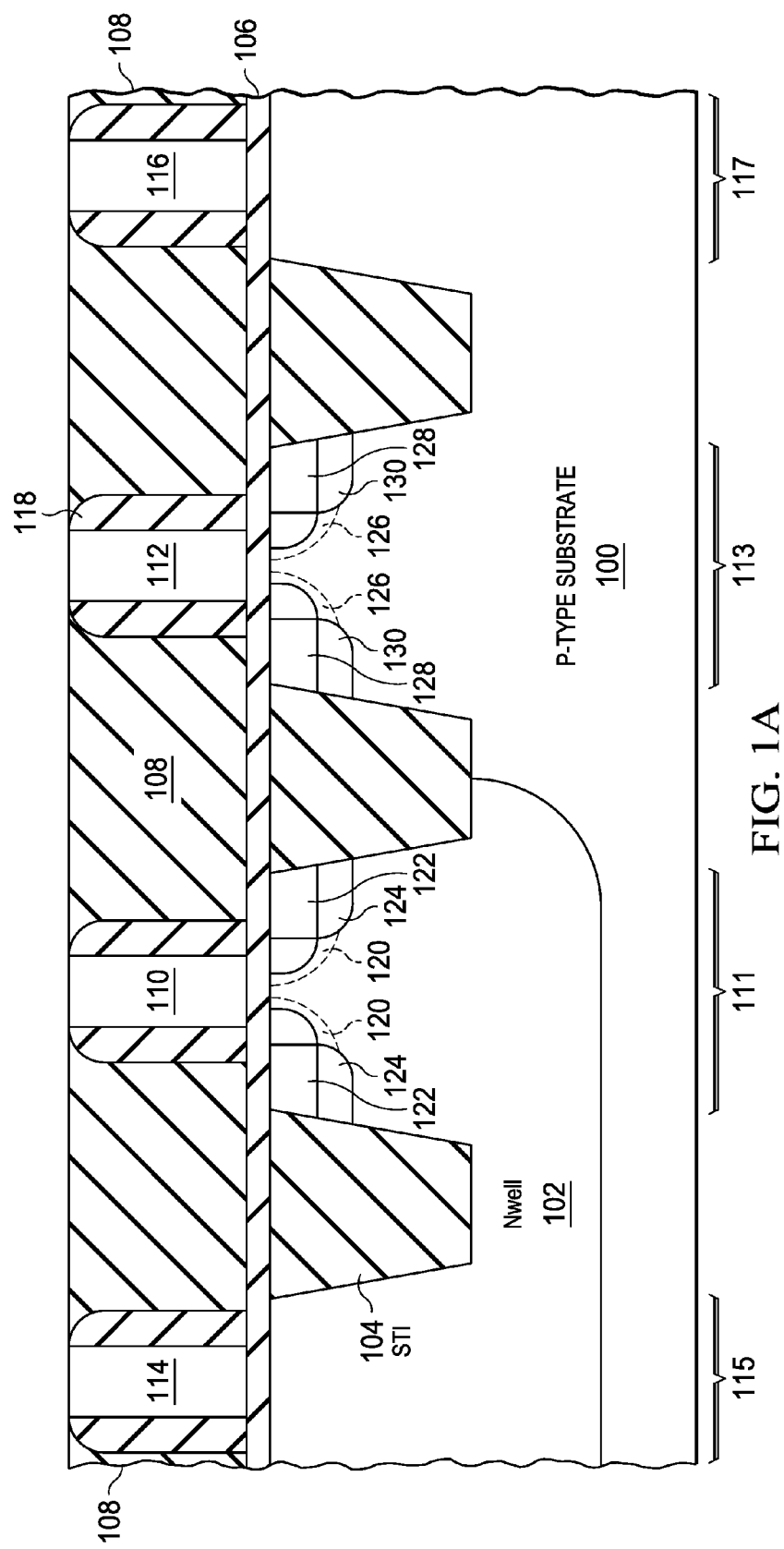
FIGS. 1A-1H are illustrations of steps in the fabrication of integrated circuits formed according to principles of the invention.
Figure 1B:
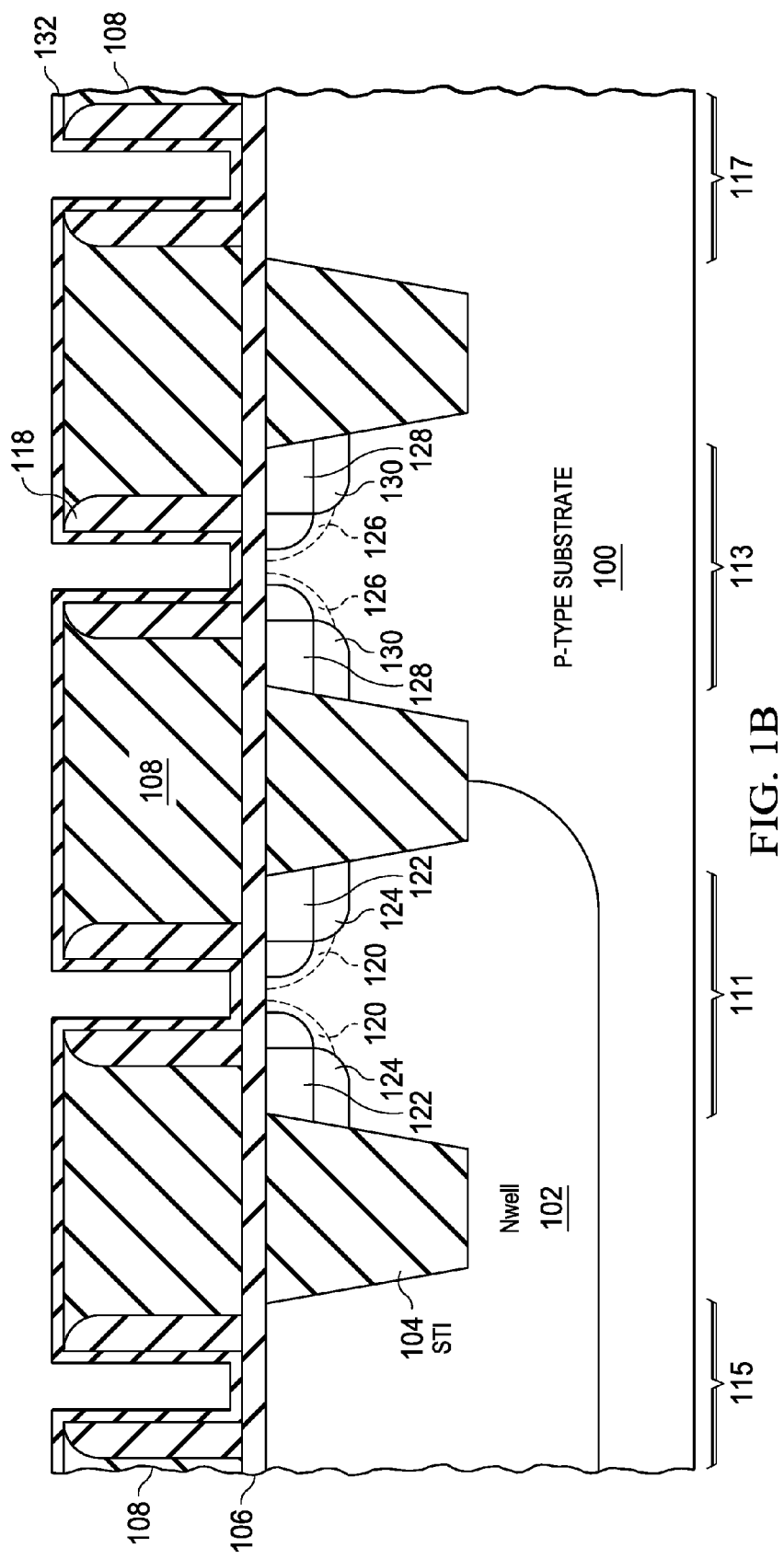
Figure 1C:
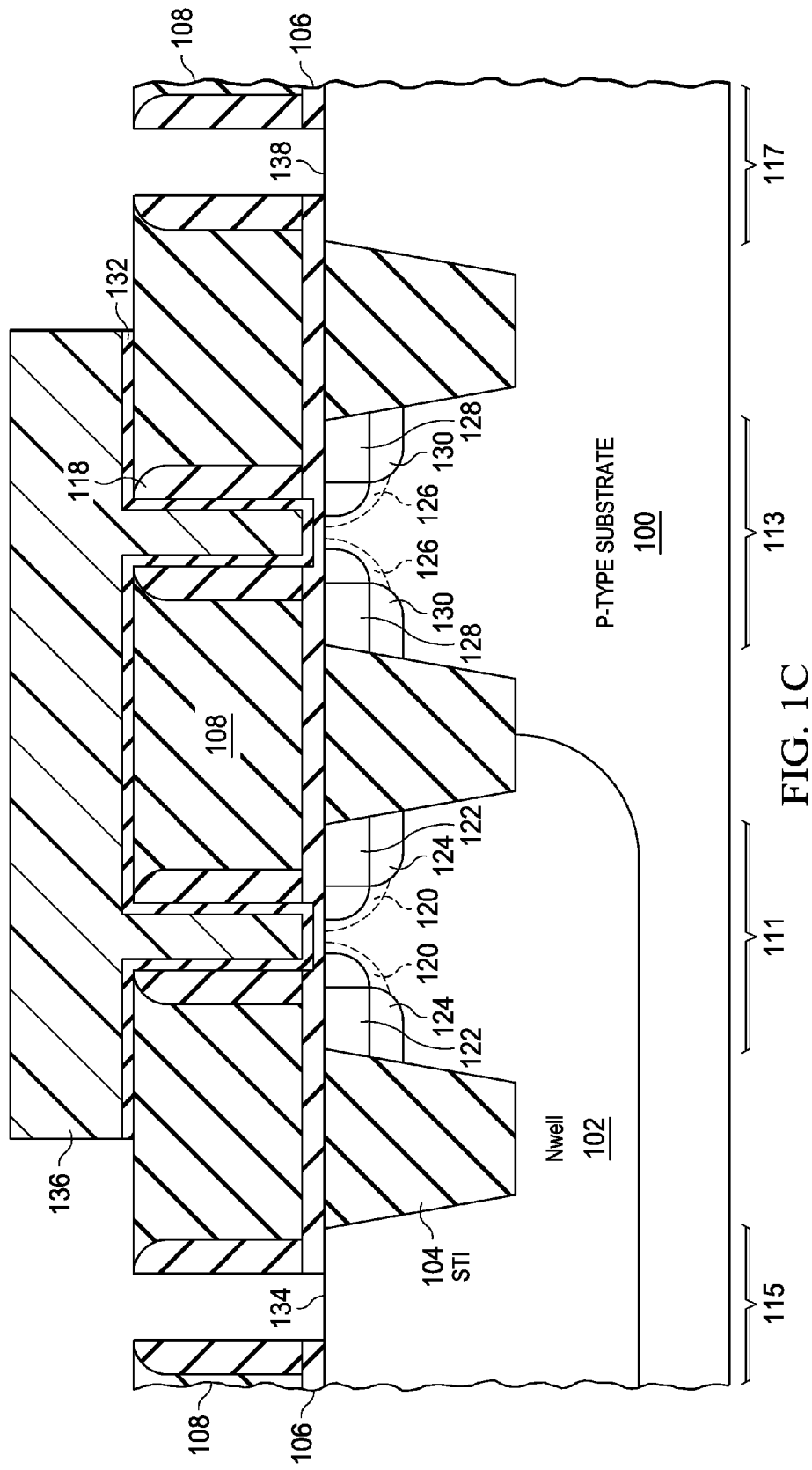
Figure 1D:
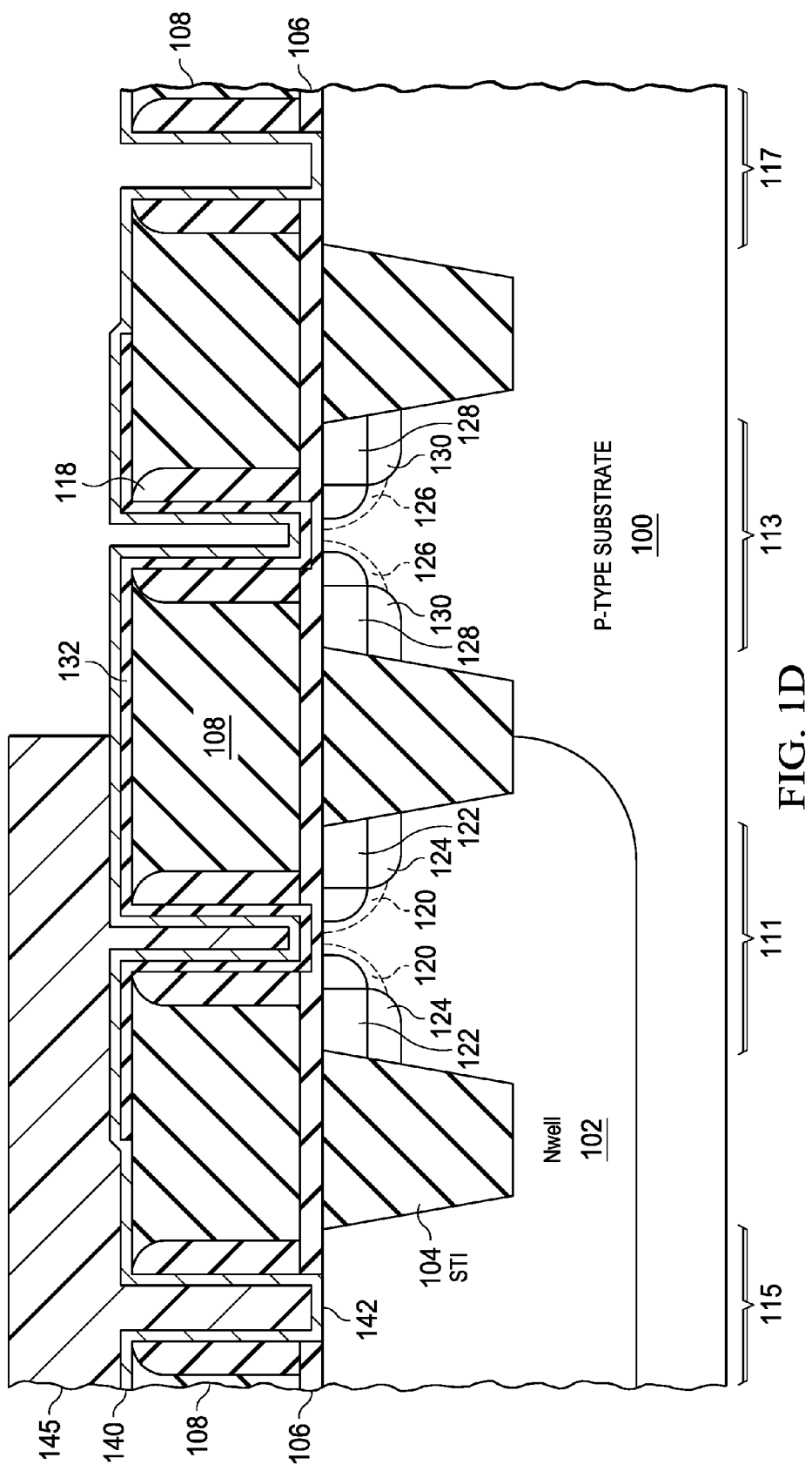
Figure 1E:
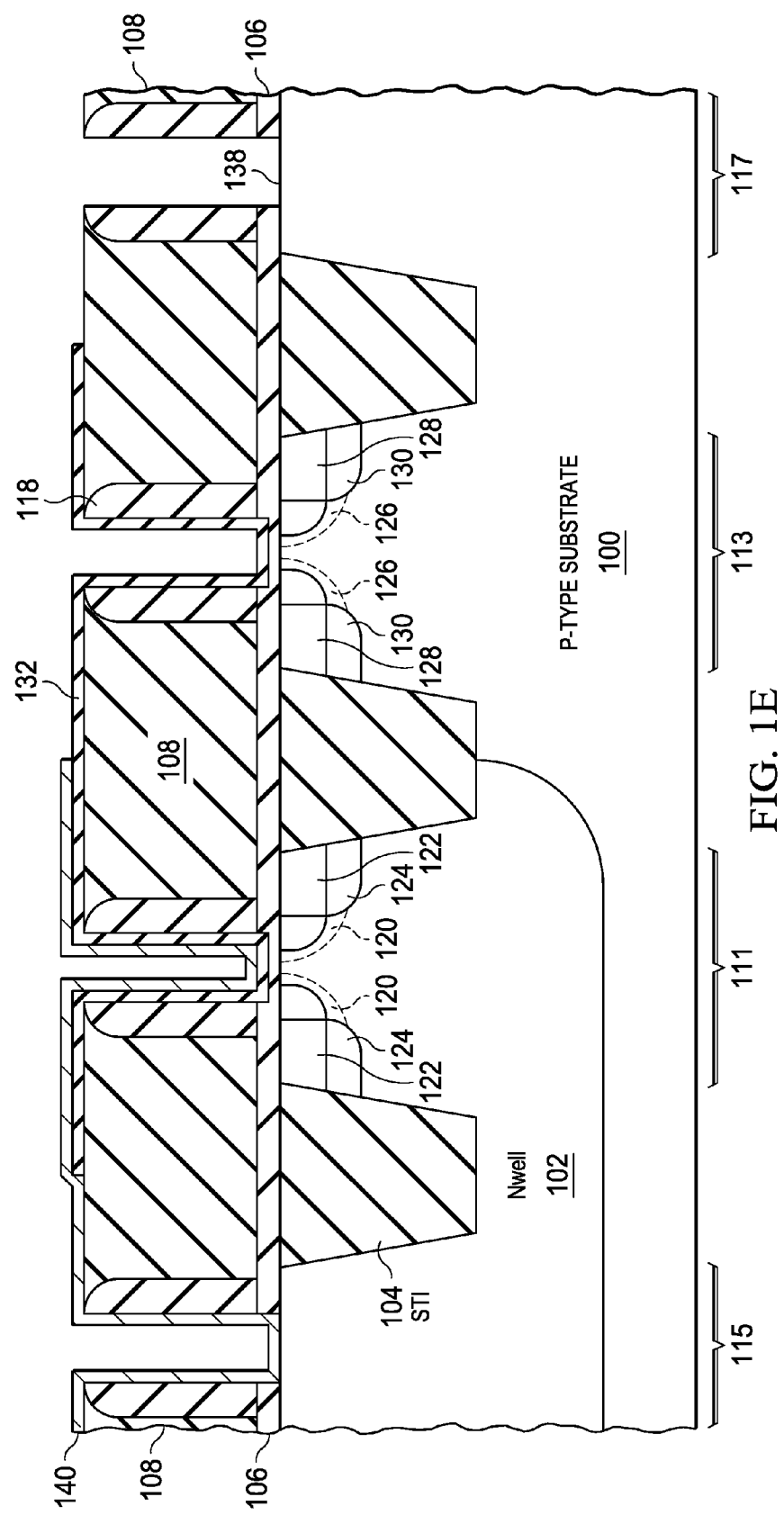
Figure 1F:
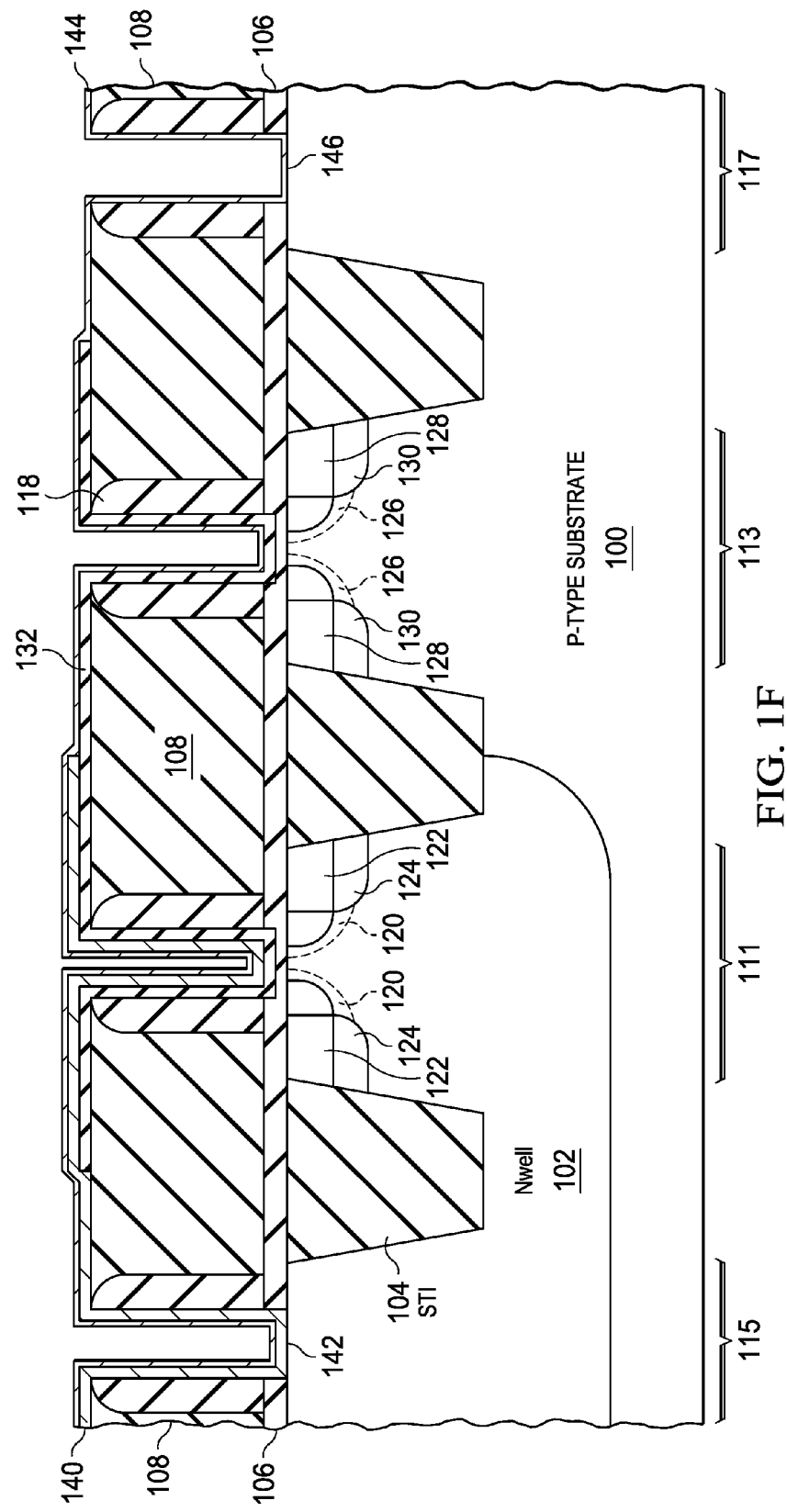
Figure 1G:
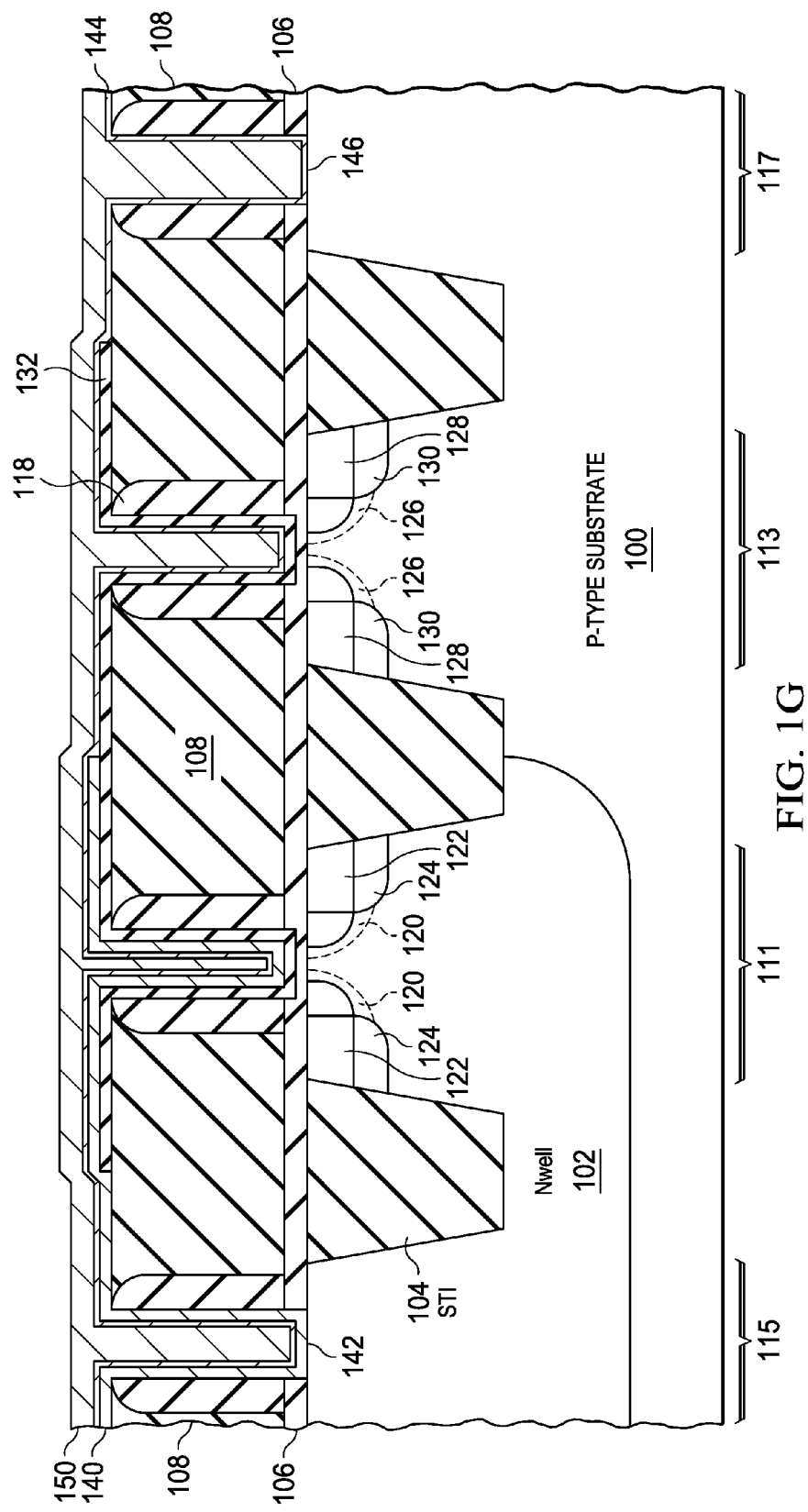
Figure 1H:
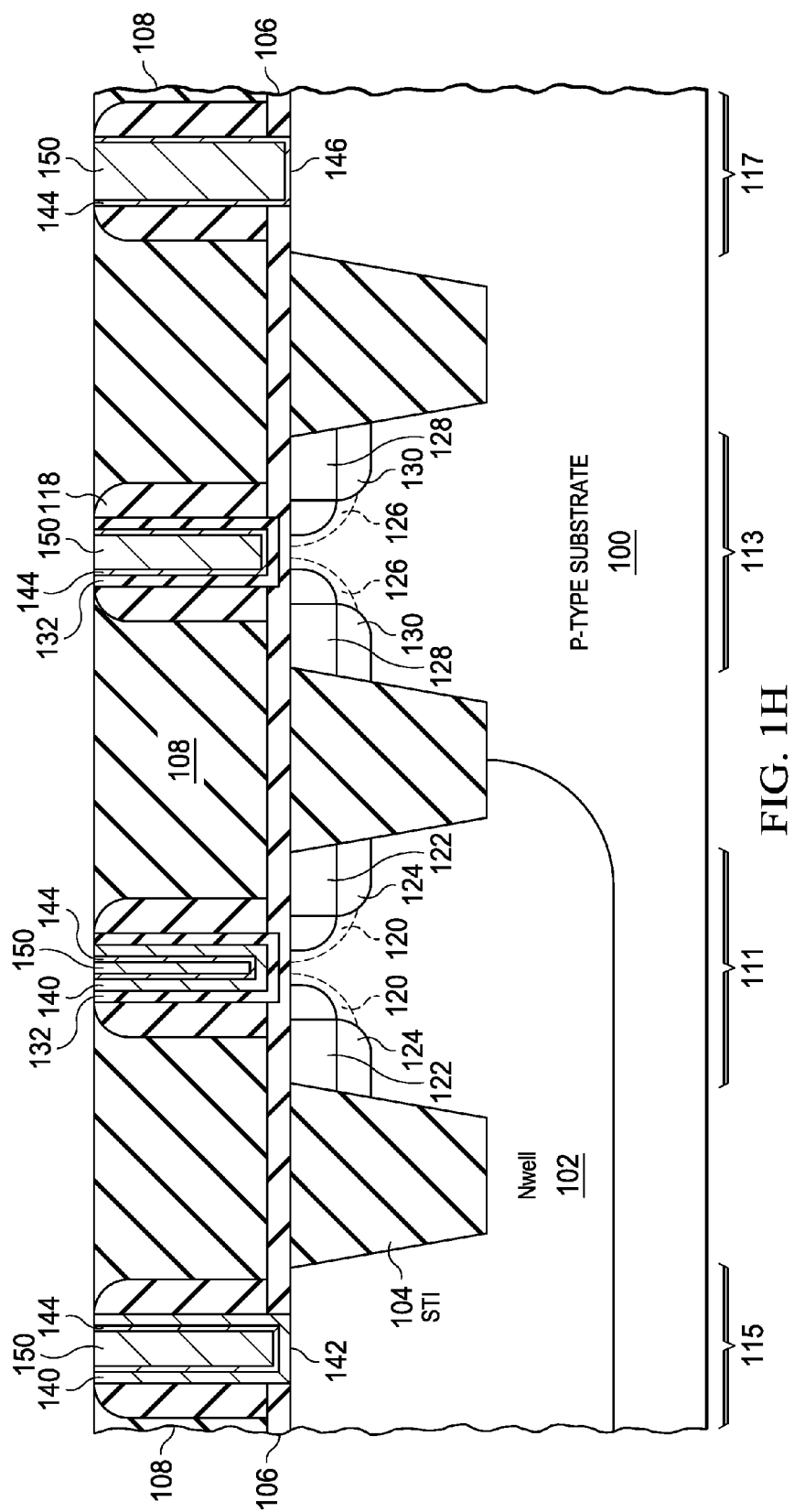

An integrated circuit with replacement metal gate n-channel metal-oxide-semiconductor (NMOS) 113 and p-channel metal-oxide-semiconductor (PMOS) 111 transistors and with an embodiment np-Schottky 117 and pn-Schottky 115 diodes is illustrated in FIG. 1H. The NMOS replacement metal gate transistor 113 and the embodiment np-Schottky diode 117 are formed in p-type substrate 100. The NMOS metal gate material 144 provides the workfunction that sets the turn on voltage (Vtn) of the NMOS transistor 113 and also provides the workfunction for the embodiment np-Schottky diode 117. The PMOS replacement metal gate transistor 111 and the embodiment pn-Schottky diode 115 are formed the nwell 102 that is formed in the p-type substrate 100. The PMOS metal gate material 140 provides the workfunction that sets the turn on voltage (Vtp) of the PMOS transistor 111 and also provides the workfunction for the embodiment pn-Schottky diode 115. Although the integrated circuit in FIG. 1H shows both embodiment pn-Schottky 115 and np-Schottky 117 diodes, an integrated circuit may contain either the embodiment np-Schottky 117 or the pn-Schottky 115 or both 117 and 115. Also the embodiments are illustrated with a p-type substrate 100 and an nwell 102 formed in the p-type substrate, but the embodiment Schottky diodes may also be formed in a n-type substrate with a p-well formed in the n-type substrate.

An embodiment process for forming an np-Schottky diode, a pn-Schottky diode, or both an np-Schottky and a pn-Schottky diode in a baseline replacement gate CMOS process flow that adds only one patterning step is illustrated in FIGS. 1A through 1H. Metal gate materials in a replacement gate integrated circuit are designed to have near band edge work functions. The work functions that are desirable for the replacement gate transistor Vt's are also desirable for embodiment Schottky diodes.

FIG. 1A shows a partially processed polysilicon replacement gate integrated circuit. An NMOS transistor 113 with a polysilicon replacement gate 112 is formed on gate dielectric 106 over p-type substrate 100. Although shown as a p-type substrate, p-type region 100 may alternatively be a p-epitaxial layer formed on a substrate of a p-type well region formed in the substrate. N-type source and drain extensions 128 with p-type halo diffusions 126 are formed self aligned to the polysilicon replacement gate 112 in the usual manner. Deep n-type source and drain diffusions 130 are formed self aligned to the dielectric sidewalls 118 on the NMOS transistor 113 polysilicon replacement gate 112.

Similarly a PMOS transistor 111 with a polysilicon replacement gate 110 on gate dielectric 106 is formed in nwell 102. P-type source and drain extensions 122 with n-type halo diffusions 120 are formed self aligned to the polysilicon replacement gate 110 in the usual manner. Deep p-type source and drain diffusions 124 are formed self aligned to the dielectric sidewalls 118 on the PMOS transistor polysilicon replacement gate 110.

Polysilicon replacement gate plug 116 over lightly doped p-type substrate 100 may be used to form an np-Schottky diode 117. The p-type substrate or pwell doping under the polysilicon replacement gate plug 116 may be in the range of about $1\times10^{15}/cm^3$ to $1\times10^{18}/cm^3$. In an example embodiment the doping is about $1.7\times10^{17}/cm^3$ Polysilicon replacement gate plug 114 over lightly doped nwell 102 may be used to form a pn-Schottky diode 115. The nwell doping under the polysilicon replacement gate plug 114 may be in the range of about $1\times10^{15}/cm^3$ to $1\times10^{18}/cm^3$. In an example embodiment the nwell doping is about $1\times10^{17}/cm^3$.

As shown in FIG. 1A, the surface of dielectric 108 is planarized using chemical mechanical polish (CMP) to expose the tops of the polysilicon replacement gates 110 and 112 and the tops of the polysilicon replacement gate plugs 114 and 116. The premetal dielectric 108 may be a dielectric such as silicon dioxide.

Referring now to FIG. 1B, the polysilicon replacement gates 110 and 112 and polysilicon plugs 114 and 116 are removed forming NMOS 113 and PMOS 111 replacement metal gate transistor trenches and forming embodiment np-Schottky 115 and pn-Schottky 115 diode trenches. Gate dielectric 106 may also be partially or completely removed. A gate dielectric 132 may then be formed on the surface of the integrated circuit, in the replacement metal gate trenches, and in the Schottky diode trenches. The gate dielectric 132 may consist of an interface layer of silicon dioxide ($SiO_2$) deposited or grown on the surface of the substrate and well plus a layer of high-k dielectric such as hafnium oxide, hafnium silicon oxynitride, lanthanum oxide, zirconium oxide, and aluminum oxide deposited on the silicon dioxide layer. In an example embodiment the gate dielectric 132 consists of about 0.5 nm of $SiO_2$ (106) chemically grown using SC1 plus about 4 nm $HfO_x$ (132) deposited using atomic layer deposition (ALD).

In FIG. 1C a Schottky photo resist pattern 136 is formed on the integrated circuit. An optional sacrificial dielectric layer such as silicon nitride may also be used beneath the photo resist to protect the surface of the high-k dielectric. The high-k dielectric 132 and the gate dielectric 106 are removed from opening 134 where the pn-Schottky diode 115 is to be formed and from opening 138 where the np-Schottky diode 117 is to be formed. The resist 136 protects the high-k dielectric 132 where the metal gate NMOS transistor 112 and where the metal gate PMOS transistor 110 are to be formed.

Referring now to FIG. 1D the PMOS metal gate material 140 is deposited. The PMOS transistor 111 metal gate material 140 will form the gate of the PMOS transistor 111 and also form a pn-Schottky 115 diode 142 to the nwell 102 where the high-k gate dielectric 132 and silicon dioxide gate dielectric 106 are removed. A PMOS transistor photo resist pattern 145 is then formed to prevent removal of the PMOS metal gate material 140 from the PMOS transistor 111 and from the pn-Schottky diode 115. The PMOS metal gate material 140 may contain, for example, one or more metals from the group consisting of titanium nitride, tantalum nitride, aluminum, and platinum with a thickness in the range of about 1 nm to 10 nm. In an example embodiment the PMOS metal gate material 140 is about 8 nm of titanium nitride with a work function of about 4.9 eV and a pn-Schottky barrier voltage of about 0.7 volts.

FIG. 1E shows the integrated circuit after the PMOS metal gate material 140 is removed from the NMOS transistor 113 and the np-Schottky diode 117 regions.

In FIG. 1F NMOS metal gate material 144 is deposited to form the metal gate of the NMOS transistor 113 and to form an np-Schottky 117 diode 146 to the p-type substrate 100 where the high-k dielectric 132 and silicon dioxide gate dielectric 106 are removed. The NMOS metal gate material 144 may contain for example, one or more metals from the group consisting of titanium, aluminum, and tungsten with a thickness in the range of about 1 nm to 4 nm. In an example embodiment the NMOS metal gate material 144 is about 3 nm of titanium-aluminum alloy with a work function of about 4.2 eV and an np-Schottky barrier diode 117 voltage of about 0.6 volts.

Referring now to FIG. 1G a filler metal 150 with low resistance such as tungsten, aluminum, or cobalt-aluminum may be used to completely fill the replacement metal gate transistor trenches and to fill the Schottky diode trenches.

As shown in FIG. 1H, CMP may be used to remove filler metal 150, NMOS metal gate material 144, and PMOS metal gate material 140 from the surface of the replacement gate dielectric 106. This planarizes the surface and electrically isolates the PMOS transistor 111 gate, NMOS transistor 113 gate, the pn Schottky diode 115 and np Schottky diode 117.

An optional anneal at a temperature greater than about 200° C. may be performed to react the NMOS metal gate material 144 with the p-type substrate 100 to improve the np-Schottky diode 117 and to react the PMOS metal gate material 140 with the nwell 102 to improve the pn-Schottky diode 115.

The formation of both pn 115 and np 117 embodiment Schottky diodes are illustrated in FIGS. 1A through 1H. A pn-Schottky diode 115 may be formed without forming an np-Schottky diode 117 or an np-Schottky diode 117 may be formed without forming a pn-Schottky diode 115 by appropriately changing the photo resist pattern 136 in FIG. 1C to prevent removal of the dielectric from either the nwell 102 diode area 115 or the p-type substrate 100 diode area 117.

Those skilled in the art to which this invention relates will appreciate that many other embodiments and variations are possible within the scope of the claimed invention.

What is claimed is:

1. An integrated circuit, comprising:
   a transistor with a metal gate formed of near band edge work function material;
   a Schottky diode formed between a Schottky metal and a substrate of the integrated circuit wherein the Schottky metal and the metal gate are the same metal.

2. The integrated circuit of claim 1, wherein the transistor is PMOS, the Schottky diode is a pn-Schottky diode, and the substrate is nwell and the near band edge work function is greater than 4.85 eV.

3. The integrated circuit of claim 2, wherein the nwell doping is in the range of about $1\times10^{15}/cm^3$ and $1\times10^{18}/cm^3$.

4. The integrated circuit of claim 2, wherein the metal is titanium nitride with a near band edge work function of about 4.9 eV.

5. The integrated circuit of claim 4, wherein a thickness of the titanium nitride is about 8 nm.

6. The integrated circuit of claim 1, wherein the transistor is NMOS, the Schottky diode is an np-Schottky diode, and the substrate is p-type substrate or pwell and the near band edge work function is less than about 4.25 eV.

7. The integrated circuit of claim 6, wherein the p-type substrate or pwell doping is in the range of about $1\times10^{15}$/cm$^3$ and $1\times10^{18}$/cm$^3$.

8. The integrated circuit of claim 6, wherein the metal is titanium-aluminum nitride with a near band edge work function of about 4.2 eV.

9. The integrated circuit of claim 8, wherein a thickness of the titanium-aluminum nitride is about 3 nm.

* * * * *